(12) United States Patent
Yang et al.

(10) Patent No.: US 6,686,292 B1
(45) Date of Patent: Feb. 3, 2004

(54) PLASMA ETCH METHOD FOR FORMING UNIFORM LINEWIDTH RESIDUE FREE PATTERNED COMPOSITE SILICON CONTAINING DIELECTRIC LAYER/ SILICON STACK LAYER

(75) Inventors: Szu-Hung Yang, Hsin-Chu (TW); Sheng-Liang Pan, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/221,958

(22) Filed: Dec. 28, 1998

(51) Int. Cl.$^7$ .............................................. H01L 21/311
(52) U.S. Cl. ...................... 438/710; 438/723; 438/724; 438/725
(58) Field of Search ................................ 438/710, 723, 438/724, 725, 706

(56) References Cited

U.S. PATENT DOCUMENTS

| | | | |
|---|---|---|---|
| 5,013,398 A | 5/1991 | Long et al. ................... | 156/643 |
| 5,094,712 A | 3/1992 | Becker et al. ............... | 156/643 |
| 5,201,993 A | 4/1993 | Langley ........................ | 156/643 |
| 5,342,801 A * | 8/1994 | Perry et al. .................... | 437/52 |
| 5,691,246 A | 11/1997 | Becker et al. ............... | 437/225 |
| 5,753,418 A * | 5/1998 | Tsai et al. .................... | 430/313 |
| 5,773,199 A * | 6/1998 | Linliu et al. ................. | 430/316 |
| 6,001,688 A * | 12/1999 | Rizzuto ........................ | 438/264 |
| 6,057,240 A * | 5/2000 | Zhou et al. ................... | 438/689 |
| 6,130,169 A * | 10/2000 | Shields et al. ............... | 438/725 |

OTHER PUBLICATIONS

Chang et al., "ULSI Technology," The McGraw–Hill Companies, Inc. 1997, pp. 354–359.

* cited by examiner

Primary Examiner—Robert Kunemund
Assistant Examiner—Terrence M. Mackey
(74) Attorney, Agent, or Firm—George O. Saile; Stephen B. Ackerman; Stephen G. Stanton

(57) ABSTRACT

A method for forming a patterned composite stack layer within a microelectronics fabrication. There is first provided a substrate. There is then formed over the substrate a blanket silicon layer. There is then formed upon the blanket silicon layer a blanket silicon containing dielectric layer. There is then formed upon the blanket silicon containing dielectric layer a patterned photoresist layer. Finally, there is etched sequentially while employing the patterned photoresist layer as a photoresist etch mask the blanket silicon containing dielectric layer and the blanket silicon layer to form a patterned composite stack layer comprising a patterned silicon containing dielectric layer coextensive with a patterned silicon layer, where the sequential etching is undertaken employing in situ in a single plasma reactor chamber or cluster of adjoining chambers a sequential plasma etch method employing a sequence of etching gas compositions which upon plasma activation perform the etching reactions with uniform linewidth dimensions and attenuated polymer residue formation and defect levels.

24 Claims, 3 Drawing Sheets

PLASMA ETCH METHOD FOR FORMING UNIFORM LINEWIDTH RESIDUE FREE PATTERNED COMPOSITE SILICON CONTAINING DIELECTRIC LAYER/ SILICON STACK LAYER

BACKGROUND OF THE INVENTION

1. Field of the Invention

The present invention relates generally to methods for forming composite multilayer stack layers on substrates within microelectronics fabrications. More particularly, the present invention relates to plasma etch methods for forming patterned composite multi-layer stack layers within microelectronics fabrications.

2. Description of the Related Art

Microelectronics fabrications are formed from microelectronics substrates over which are formed patterned microelectronics conductor layers which are separated by microelectronics dielectric layers.

As microelectronics fabrication integration levels have increased and microelectronics fabrication device and patterned conductor layer dimensions have decreased, it has become increasingly important to efficiently form within microelectronics fabrications patterned composite silicon containing dielectric layer/polysilicon layer/multi-layer stack layers. Such patterned silicon containing dielectric layer/polysilicon layer/multi-layer stack layers may be employed within microelectronics fabrications for forming various microelectronics structures. In particular, such patterned composite silicon containing dielectric layer/ polysilicon layer/multi-layer stack layers may be formed on underlying layers of silicon oxide gate oxide dielectric layers which in turn are formed upon or over silicon semiconductor substrates employed in microelectronics fabrications for applications such as but not limited to polysilicon capacitors, as well as gate electrodes employed within field effect transistors (FETs) such as electrically erasable programmable read only memory (EEPROM) field effect transistors (FETs) which are also known as electrically alterable programmable read only memory (EAPROM) field effect transistors (FETs).

While patterned composite silicon containing dielectric layer/polysilicon layer multi-layer stack layers are thus desirable within the art of microelectronics fabrication, patterned composite silicon containing dielectric layer/ polysilicon layer multi-layer stack layers are nonetheless not formed entirely without problems within microelectronics fabrication. In particular, patterned composite silicon containing dielectric layer/polysilicon layer multi-layer stack layers when formed within microelectronics fabrications while employing a conventional plasma etch method employing a patterned photoresist etch mask layer often suffer from detrimental effects, such as non-uniform dimensions of patterns, in particular conductor linewidths, and polymeric residues from etching the desired pattern in the dielectric layer/polysilicon layer multi-layer stack. Although polymeric residue formation and other defect effects may often be attenuated when forming patterned composite silicon containing dielectric layer/polysilicon layer multi-layer stack layers while employing more sophisticated plasma etch methods, such alternative plasma etch methods typically provide enhanced process complexity and cost when forming patterned composite silicon containing dielectric layer/polysilicon layer multi-layer stack layers.

It is thus towards the goal of forming with enhanced linewidth uniformity and attenuated polymeric residue formation within a microelectronics fabrication a patterned composite silicon containing dielectric layer/polysilicon layer/multi-layer stack layer that the present invention is more specifically directed. In a more general sense, the present invention is also directed towards the goal of forming with enhanced linewidth uniformity, attenuated polymeric residue formation and reduced defect levels within a microelectronics fabrication a patterned composite silicon containing dielectric layer/silicon layer/multi-layer stack layer, where the silicon layer need not necessarily be a polysilicon layer.

Various plasma etch methods have been disclosed within the art of microelectronics fabrication for forming patterned microelectronics layers within microelectronics fabrications.

For example, Lii, in "ULSI Technology" Chang and Sze, eds., McGraw-Hill Company, Inc.(1997), p.354, discloses the chemistries and process parameters suitable for forming patterned layers by plasma etching methods. Such patterned layers may be formed from dielectric materials such as silicon oxide and silicon nitride, as well as conductive materials such as polysilicon, tungsten suicide, aluminum and the like.

Further, Becker et al., in U.S. Pat. No. 5,094,712, discloses a plasma etch method for efficiently forming an anisotropically patterned composite silicon oxide/tungsten silicide/polysilicon stack layer within an integrated circuit microelectronics fabrication. The method employs a single plasma reactor chamber within which there is sequentially and anisotropically etched: (1) a blanket silicon oxide layer while employing a carbon tetrafluoride, trifluoromethane and inert gas plasma to form a patterned silicon oxide layer; (2) a blanket tungsten silicide layer while employing a helium, oxygen and sulfur hexafluoride plasma to form a patterned tungsten silicide layer co-extensive with the patterned silicon oxide layer; and (3) a blanket polysilicon layer while employing a hydrogen bromide and chlorine plasma to form a patterned polysilicon layer co-extensive with the patterned tungsten silicide layer and the patterned silicon oxide layer.

Still further, Becker, in U.S. Pat. No. 5,691,246, discloses a method for plasma etching, in a single chamber, a silicon oxide/polysilicon/silicon oxide multilayer structure. Within the method, both silicon oxide layers are anisotropically etched and the polysilicon layer is isotropically etched to recess the edges of the polysilicon layer from the edges of the silicon oxide layers.

Yet further still, Long et al., in U.S. Pat. No. 5,013,392, disclose a method for etching anisotropically within a single reactor chamber a multi-layer structure comprising a silicon dioxide/polycrystalline silicon/silicon dioxide stack layer. The method employs a first etching gas atmosphere comprising a mixture of SF6, CHF3 and He for etching the first silicon dioxide layer, and a second etching gas atmosphere comprising a mixture of HBr and He for etching the polycrystalline silicon.

Finally, Langley., in U.S. Pat. No. 5,201,993, discloses a method for plasma etching anisotropically, in a single reactor chamber, a silicon oxide /silicide stack layer while employing an inert carrier gas incorporated into an etching atmosphere. The fully etched multi-layer structure has a vertical profile at or near 90 degrees from the horizontal, with no bowing or notching. The method employs a silicon oxide etch step which utilizes a gas mixture comprising C2F6, CF4, CHF3 and an inert carrier gas as the etching gas atmosphere.

Desirable in the art of microelectronics fabrication are methods through which there may be formed with uniform linewidth and with attenuated polymer residue formation and defect levels a patterned composite silicon containing dielectric layer/silicon layer/multi-layer stack layer within a microelectronics fabrication. More particularly desirable in the art of microelectronics fabrication are methods through which there may efficiently and with attenuated polymer residue formation and reduced particulate defect levels be formed a patterned composite single or multiple silicon containing dielectric layer/polysilicon layer/multi-layer stack upon a silicon oxide layer upon a semiconductor substrate employed within a microelectronics fabrication.

It is towards the foregoing goals that the present invention is both generally and more specifically directed.

SUMMARY OF THE INVENTION

A first object of the present invention is to provide a method for forming within a microelectronics fabrication a patterned composite silicon containing dielectric layer/polysilicon layer multi-layer stack layer.

A second object of the present invention is to provide a method in accord with the first object of the present invention, where the patterned composite silicon containing dielectric layer/polysilicon layer multi-layer stack layer is formed with uniform linewidth and attenuated polymer residue formation and defect levels.

A third object of the present invention is to provide a method in accord with the first object of the present invention or the second object of the present invention, which method is readily commercially implemented.

In accord with the objects of the present invention, there is provided a method for forming within a microelectronics fabrication a patterned composite multi-layer stack. To practice the method of the present invention, there is first provided a substrate. There is then formed on the substrate a blanket silicon layer. There is then formed upon the blanket silicon layer a blanket silicon containing dielectric layer. There is then formed upon the blanket silicon containing dielectric layer a patterned photoresist layer. Finally, there is then etched sequentially while employing the patterned photoresist layer as a photoresist etch mask layer the blanket silicon containing dielectric layer and the blanket silicon layer to form a patterned composite layer stack comprising a patterned silicon containing dielectric layer co-extensive with a patterned silicon layer on a substrate, where the sequential etching is undertaken in situ employing a single plasma reactor chamber with a sequence of etching gas compositions and plasma etching conditions.

The present invention provides a method for forming with uniform linewidth and attenuated polymer residue formation and defect levels within a microelectronics fabrication a patterned composite of a silicon containing dielectric layer/silicon layer/multi-layer stack layer. The method of the present invention realizes the foregoing objects by employing when forming the patterned composite silicon containing dielectric layer/silicon layer/multi-layer stack layer a plasma etching method in conjunction with a single reactor chamber in which successive etching gas compositions sequentially etch the desired pattern while removing polymer residues such that uniform linewidths, attenuated polymer residue formation and reduced defect levels are achieved for the entire silicon containing dielectric layer/silicon layer multi-layer stack.

The method of the present invention is readily commercially implemented. The method of the present invention employs methods and materials as are generally known in the art of microelectronics fabrication. Since it is a novel ordering of methods and materials which provides at least in part the present invention, rather than the existence of methods and materials which provides the present invention, the method of the invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides a plasma etch method for efficiently forming with uniform linewidth, and attenuated polymer residue formation and defect levels, within a microelectronics fabrication a patterned composite silicon containing dielectric layer/polysilicon layer/multi-layer stack layer. The present invention realizes the foregoing objects by employing a plasma etching gas atmosphere of CF4 and O2 to remove polymer residues when forming the patterned composite silicon containing dielectric layer/polysilicon layer/multi-layer stack layer. The patterned composite silicon containing dielectric layer/polysilicon layer/multi-layer stack layer is formed by a method which employs a first etchant gas composition which upon plasma activation etches the silicon containing dielectric layer followed by a second plasma etch step which removes the polymer residue formed in plasma etching.

The method of the present invention is advantageous in that there is efficient etching of the patterned composite silicon containing dielectric layer/polysilicon layer/multi-layer stack layer within a single plasma reaction chamber or cluster of adjoining chambers employing a succession of plasma etching gas atmospheres. Thus, there results in addition to attenuated polymer residue formation a reduced generation of particulate defect levels due to polymer flaking and reduced handling and therefore higher through put as well as higher manufacturing yields.

Although the method of the present invention provides value when forming within silicon semiconductor integrated circuit fabrications patterned composite silicon containing dielectric layer/polysilicon layer/multi-layer stack layers upon silicon oxide gate oxide layers which may be employed as the gate electrodes within field effect transistors (FETs), the present invention may be employed when fabricating within microelectronics fabrications including but not limited to semiconductor integrated circuit fabrications, solar cell microelectronics fabrications, ceramic substrate microelectronics fabrications and flat panel display microelectronics fabrications patterned composite silicon containing dielectric layer/polysilicon layer multi-layer stack layers which may be employed within microelectronics structures including but not limited to gate electrode structures in general and within certain types of field effect transistors (FETs) within silicon semiconductor integrated circuit microelectronics fabrications more particularly.

First Preferred Embodiment

Figure 1:
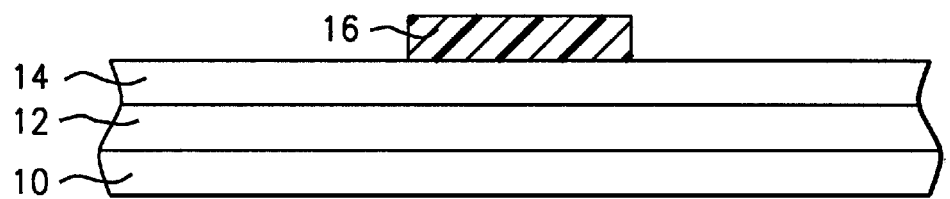
FIG. 1, FIG. 2, FIG. 3 and FIG. 4 show a series of schematic cross-sectional diagrams illustrating the results of forming within a microelectronics fabrication in accord with a general embodiment of the present invention which comprises a first preferred embodiment of the present invention a patterned composite silicon containing dielectric layer/silicon layer/multi-layer stack layer.

Referring now to FIG. 1 to FIG. 4, there is shown a series of schematic cross-sectional diagrams illustrating the results of forming within a microelectronics fabrication in accord with a general embodiment of the present which comprises a first preferred embodiment of the present invention a patterned composite single or multiple silicon containing dielectric/polysilicon layer/multi-layer stack layer within the microelectronics fabrication. Shown in FIG. 1 is a schematic cross-sectional diagram of the microelectronics fabrication at an early stage in its fabrication in accord with the first preferred embodiment of the present invention.

Shown in FIG. 1 is a substrate 10 having formed thereupon or thereover a series of two blanket layers. The series of two blanket layers includes: (1) a blanket silicon layer 12; and (2) a blanket silicon containing dielectric layer 14 formed upon the blanket silicon layer 12. Finally, there is also shown within FIG. 1 a patterned photoresist layer 16 formed upon the blanket silicon containing dielectric layer 14.

Within the first preferred embodiment of the present invention with respect to substrate 10, the substrate may be a substrate employed within a microelectronics fabrication selected from the group including but not limited to a semiconductor integrated microelectronics fabrication, a solar cell microelectronics fabrication, a ceramics substrate microelectronics fabrication or a flat panel display microelectronics fabrication. Although not specifically illustrated within the schematic cross-sectional diagram of FIG. 1, the substrate 10 may be a substrate alone employed within a microelectronics fabrication, or in the alternative, the substrate 10 may be a substrate employed within a microelectronics fabrication, where the substrate has formed thereupon or thereover any of several additional microelectronics layers as are conventionally employed within the microelectronics fabrication. The uppermost surface of the substrate or of any layer formed thereupon is preferably of a material which functions as a non-reactive etching stop material for the plasma etching reactions employed in the formation of the patterned composite silicon containing dielectric layer/ silicon layer/multi-layer stack layer in accord with the method of the first preferred embodiment. Such additional microelectronics layers may include, but are not limited to, microelectronics conductor layers, microelectronics semiconductor layers and microelectronics dielectric layers.

Within the first preferred embodiment of the present invention with respect to the blanket silicon containing dielectric layer 14, the blanket silicon containing dielectric layer 14 may be formed employing methods and materials conventional in the art of microelectronics fabrication, such methods including but not limited to thermal oxidation of silicon, chemical vapor deposition (CVD) methods, plasma enhanced chemical vapor deposition (PECVD) methods and physical vapor deposition (PVD) sputtering methods to form silicon oxide, silicon nitride or silicon oxynitride materials, for example. With respect to the blanket silicon layer 12, the blanket silicon layer 12 may be formed employing methods conventional in the art of microelectronics fabrication, such methods including but not limited to chemical vapor deposition (CVD) methods, plasma enhanced chemical vapor deposition (PECVD) methods and physical vapor deposition (PVD) sputtering methods to form a blanket silicon layer of monocrystalline silicon, polycrystalline silicon or amorphous silicon, for example. The blanket silicon layer 12 is more preferably a blanket polysilicon layer having incorporated therein a suitable dopant at a concentration of from about $1 \times 10^{15}$ to about $1 \times 10^{16}$ dopant atoms per cubic centimeter to provide the blanket silicon layer 12 with a resistivity of from about 7 to about 15 ohms per square. Preferably, the blanket polysilicon layer is formed to a thickness of about 3000 angstroms.

Within the first preferred embodiment of the present invention with respect to the patterned photoresist layer 16, the patterned photoresist layer 16 may be formed employing photoresist materials as are conventional in the art of microelectronics fabrication, including photoresist materials selected from the general groups of photoresist materials including but not limited to positive photoresist and negative photoresist materials. Preferably, the patterned photoresist layer 16 is formed to a thickness of about 13,000 angstroms.

Figure 2:
Figure 2:
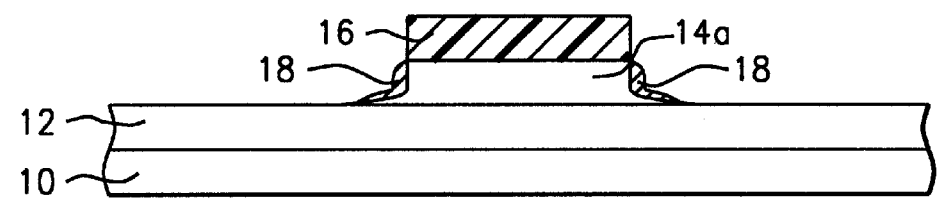

Referring now to FIG. 2, there is shown a schematic cross-sectional diagram illustrating the results of further processing of the microelectronics fabrication whose schematic cross-sectional diagram is illustrated in FIG. 1. Shown in FIG. 2 is a schematic cross-sectional diagram of a microelectronics fabrication otherwise equivalent to the microelectronics fabrication illustrated in FIG. 1, but wherein the blanket silicon containing dielectric layer 14 has been partially patterned, while employing a first etching plasma 20 along with the patterned photoresist layer 16 as an etch mask layer, to form a patterned silicon containing dielectric layer 14a upon the substrate 10, along with a polymer residue 18 formed upon the sidewalls of the patterned silicon containing dielectric layer 14a and bridging to the surface of the blanket silicon layer 12.

Within the first preferred embodiment of the present invention with respect to the first etching plasma 20, the first etching plasma 20 is employed within a single plasma reaction chamber, and the first etching plasma 20 employs a first etching gas composition to anisotropically etch the blanket silicon containing dielectric layers 14. There is then employed a subsequent second etching gas composition to attenuate the amount of polymer residue formed from the anisotropic etching of the blanket silicon containing dielectric layer, and finally there is then employed a third etching gas composition to etch the blanket silicon layer 12. Within the first preferred embodiment of the present invention, the first etching gas employed is perfluoromethane CF4 which upon plasma activation at least partially anisotropically etches the silicon containing dielectric layer 14. Thereafter, a subsequent second plasma etching gas comprising perfluoromethane CF4 and oxygen O2 is employed which upon plasma activation completes the anisotropic etching of any remaining portion of the blanket silicon containing dielectric layer 14, while simultaneously attenuating the amount of polymer residue 18 formed during the anisotropic etching step. Finally, the third and final plasma etching gas comprising chlorine Cl2 and hydrogen bromide HBr is employed, which upon plasma activation anisotropically etches the blanket silicon layer 12.

Within the first preferred embodiment of the method of the present invention, in addition to perfluoromethane (CF4), the perfluorocarbon etching gas may be selected from the group of perfluorocarbon compounds containing up to five carbon atoms in the molecular structure.

Figure 3:
Figure 3:
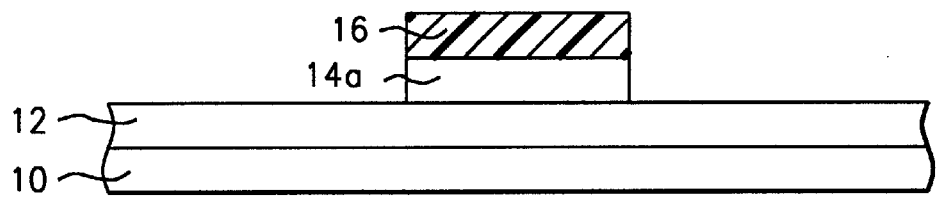

Referring now to FIG. 3, there is shown a schematic cross-sectional diagram illustrating the results of further processing of the microelectronics fabrication whose schematic cross-sectional diagram is illustrated in FIG. 2. Shown in FIG. 3 is a schematic cross-sectional diagram of a microelectronics fabrication otherwise equivalent to the microelectronics fabrication whose schematic cross-sectional diagram is illustrated in FIG. 2, but wherein there is stripped from the patterned silicon containing dielectric layer 14a the polymer residue 18 by means of a second plasma 22 which employs a second plasma etching gas atmosphere comprising CF4 and O2, which serves to remove the polymer residue 18, while completing if necessary the etching of the blanket silicon containing dielectric layer 14 to form the patterned silicon containing dielectric layer 14a.

Within the preferred first embodiment of the present invention, the plasma etching atmosphere is employed at a pressure of from about 80 to about 600 mTorr to minimize the formation of polymer residues and polymer flaking particulate defect levels. Likewise, the plasma etching gas composition preferably excludes hydrofluorocarbon substances such as CHF3 because the latter are known to enhance the formation of polymer residue during the etching operation.

Figure 4:
Figure 4:
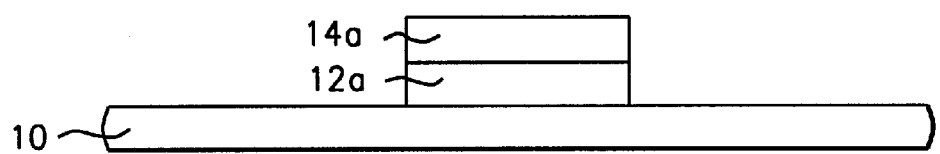

Referring now more particularly to FIG. 4, there is shown a schematic cross-sectional diagram illustrating the results of further processing of the microelectronics fabrication whose schematic cross-sectional diagram is shown in FIG. 3. Shown in FIG. 4 is a schematic cross-sectional diagram of a microelectronics fabrication otherwise equivalent to FIG. 3, but wherein the blanket silicon layer 12 has been patterned, while employing the photoresist mask 16 and a third plasma etching gas 24, to form the patterned silicon layer 12a co-extensive with the patterned silicon containing dielectric layer 14a, and the patterned photoresist layer 16 has been subsequently stripped using methods conventional in the art of microelectronics fabrication.

Within the method of the first preferred embodiment of the present invention, the third plasma etching gas comprises Cl2 and HBr employed within a single plasma reactor or a cluster of adjoining plasma reactor chambers at a pressure of between about 100 to about 600 mTorr.

Upon forming the microelectronics fabrication whose schematic cross-sectional diagram is illustrated in FIG. 4, there is formed a microelectronics fabrication having formed therein a patterned composite silicon containing dielectric layer/polysilicon layer multi-layer stack layer upon a substrate. The pattern ed composite silicon containing dielectric layer/polysilicon layer/multi-layer stack layer comprises a patterned silicon containing dielectric layer upon a co-extensive patterned polysilicon layer, where the patterned composite silicon containing dielectric layer/polysilicon layer/multi-layer stack layer is formed efficiently with uniform linewidth and attenuated polymer residue formation and defect levels. The method of the present invention realizes the foregoing objects by employing when forming the patterned composite silicon containing dielectric layer/polysilicon layer/multilayer stack layer a patterned photoresist layer and a series of corresponding blanket layers from which is subsequently formed the patterned composite silicon containing dielectric layer/polysilicon layer multi-layer stack layer, along with a single plasma reaction chamber employing a first etchant gas composition which upon plasma activation anisotropically etches the blanket silicon containing dielectric material, a second etching gas composition which attenuates the amount of polymer residue formed from the etching reaction, and a third etching gas composition which upon plasma activation anisotropically etches the blanket polysilicon layer.

Second Preferred Embodiment

Figure 5:
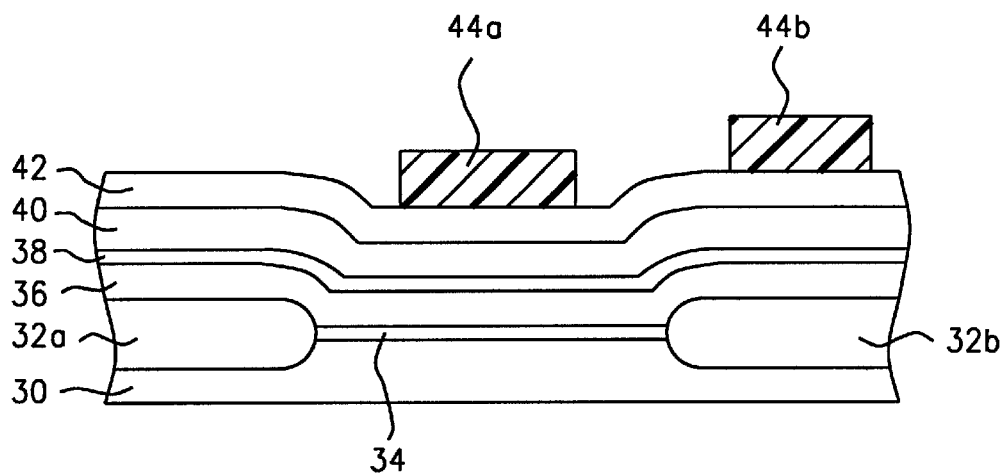
FIG. 5, FIG. 6 and FIG. 7, and FIG. 8 are a series of schematic cross-sectional diagrams illustrating the results of forming within a semiconductor integrated circuit microelectronics fabrication in accord with a more specific embodiment of the present invention which comprises a second preferred embodiment of the present invention a gate electrode which may be employed within a field effect transistor (FET).

Referring now to FIG. 5 to FIG. 8, there is shown a series of schematic cross-sectional diagrams illustrating the results of forming within a silicon semiconductor integrated circuit microelectronics fabrication in accord with a more specific embodiment of the present invention which comprises a second preferred embodiment of the present invention a pair of patterned composite silicon containing dielectric layer/polysilicon layer/multi-layer stack layers in accord with the method of the present invention. Shown in FIG. 5 is a schematic cross-sectional diagram of the silicon semiconductor integrated circuit microelectronics fabrication at an early stage in its fabrication in accord with the method of the present invention.

Shown in FIG. 5 is a semiconductor substrate 30 having formed within and upon its surface a pair of isolation regions 32a and 32b which define an active region of the surface of the semiconductor substrate 30. Although semiconductor substrates are known in the art of semiconductor integrated circuit microelectronics with either dopant polarity, several dopant concentrations, and various crystallographic orientations, for the second preferred embodiment of the present invention, the semiconductor substrate 30 is preferably a (100) silicon semiconductor having an N- or P-type doping.

Similarly, although it is known in the art of semiconductor integrated circuit microelectronics fabrication that isolation regions may be formed within and upon semiconductor substrates while employing methods including but not limited to isolation region thermal silicon oxide growth methods and isolation region deposition/patterning methods, for the second preferred embodiment of the present invention the isolation regions 32a and 32b are preferably formed within and upon the semiconductor substrate 30 while employing an isolation region thermal silicon oxide growth method at a temperature of between about 700 to about 1300 degrees centigrade to form within and upon the semiconductor substrate 30 the pair of isolation regions 32a and 32b of silicon oxide.

There is also shown in FIG. 5 formed covering the active region of the semiconductor substrate 30 a blanket gate dielectric layer 34. Although it is known in the art of semiconductor integrated circuit microelectronics fabrication that gate dielectric layers may be formed employing methods including but not limited to gate dielectric layer thermal oxidation of silicon methods and gate dielectric layer deposition/patterning methods, for the second preferred embodiment of the present invention the blanket gate dielectric layer 34 is preferably formed employing a blanket gate dielectric thermal oxidation of silicon method at a temperature of from about 700 to about 1300 degrees centigrade to form the blanket gate dielectric layer 34 of silicon oxide of thickness of from about 100 to about 600 angstroms upon the active region of the semiconductor substrate 30.

Finally, there is shown in FIG. 5 formed upon or over the semiconductor substrate 30 including the pair of isolation regions 32a and 32b and the blanket gate dielectric layer 34 a series of four blanket layers, where the uppermost blanket layer within the series of four blanket layers has formed thereupon a pair of patterned photoresist layers 44a and 44b. The four blanket layers within the series of four blanket layers include: (1) a blanket polysilicon layer 36 formed most closely to the semiconductor substrate 30 (2) a first blanket silicon oxide layer 38 formed upon the blanket polysilicon layer 36; (3) a blanket silicon nitride layer 40 formed upon the first blanket silicon oxide layer 38; and (4) a second blanket silicon oxide layer 42 formed upon the silicon nitride layer 40.

Within the second preferred embodiment of the present invention, the blanket polysilicon layer 36 is preferably formed employing methods, materials and dimensions analogous or equivalent to the methods, materials and dimensions employed in forming the blanket polysilicon layer 12 within the first preferred embodiment of the present invention as illustrated within the schematic cross-sectional diagram of FIG. 1. Similarly, within the second preferred embodiment of the present invention the blanket first silicon oxide layer 38, the blanket silicon nitride layer 40 and the second blanket silicon oxide layer 42 are preferably formed employing methods, materials and dimensions analogous or equivalent to the methods, materials and dimensions employed in forming the blanket silicon containing dielectric layer 14 or equivalent within the first preferred embodiment of the present invention as illustrated in the schematic cross-sectional diagram of FIG. 1. Preferably, the blanket first silicon oxide layer 38 is formed to a thickness of from about 30 to about 200 angstroms, the blanket silicon nitride layer 40 is formed to a thickness of from about 200 to about 700 angstroms; and the the blanket second silicon oxide layer 42 is formed to a thickness of from about 300 to about 900 angstroms.

Within the second preferred embodiment of the present invention with respect to the patterned photoresist layers 44a and 44b, each of the patterned photoresist layers 44a and 44b is preferably formed employing methods, materials and dimensions analogous or equivalent to the methods, materials and dimensions employed in forming the patterned photoresist layer 16 within the first preferred embodiment of the present invention as illustrated within the schematic cross-sectional diagram of FIG. 1. Within the second preferred embodiment of the present invention, a linewidth of the patterned photoresist layer 44a is preferably from about 1 to about 10 microns, while a linewidth of the patterned photoresist 44b is also preferably from about 1 to about 10 microns.

Figure 6:
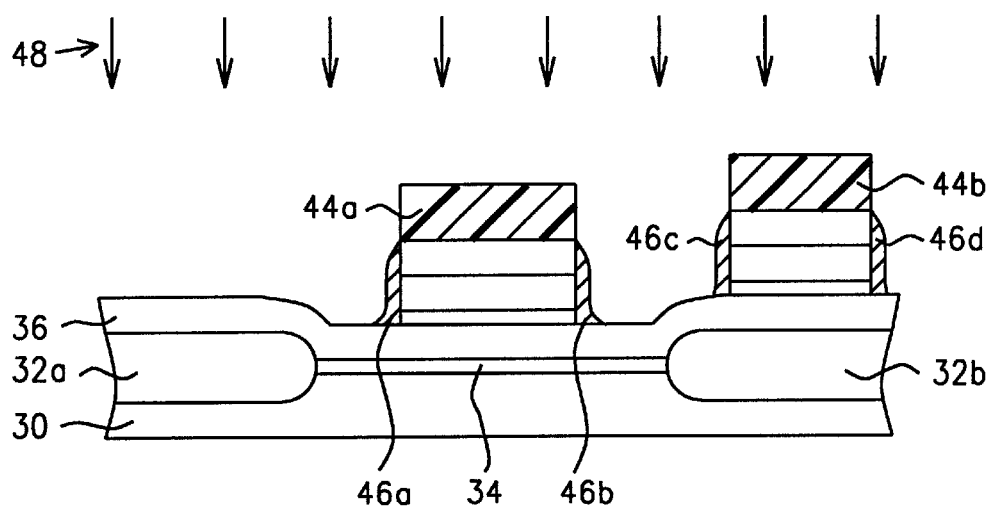

Referring now to FIG. 6, there is shown a schematic cross-sectional diagram illustrating the results of further processing of the semiconductor integrated circuit microelectronics fabrication whose schematic cross-sectional diagram is shown in FIG. 5. Shown in FIG. 6 is a schematic cross-sectional diagram of a semiconductor integrated circuit microelectronics fabrication otherwise equivalent to the semiconductor integrated circuit microelectronics fabrication whose schematic cross-sectional diagram is illustrated in FIG. 5, but wherein each of the blanket first silicon oxide layer 38, the blanket silicon nitride layer 40 and the blanket second silicon oxide layer 42 has been patterned to form a corresponding series of patterned first silicon oxide layers 38a and 38b, patterned silicon nitride layers 40a and 40b and patterned second silicon oxide layers 42a and 42b, while employing the pair of patterned photoresist layers 44a and 44b as a corresponding pair of etch mask layers and while employing an etching plasma 48.

Within the second preferred embodiment of the present invention, the etching plasma 48 is preferably formed employing methods and materials analogous or equivalent to the methods and materials which are employed in forming the etching plasma 20 within the first preferred embodiment of the present invention as illustrated within the schematic cross-sectional diagram of FIG. 2. Within the second preferred embodiment of the present invention the etching plasma preferably employs a single plasma reaction chamber or a single cluster of adjoining reactor chambers and a series of sequential plasma etching gas compositions analogous or equivalent to the plasma etching gas combinations employed within the first preferred embodiment of the present invention.

Preferably the first etching plasma 48 employs a sequence of etching gas compositions in succession in the single plasma reactor chamber: (1) tetrafluoromethane CF4; (2) tetrafluoromethane CF4 and oxygen O2; and (3) hydrogen bromide HBr and chlorine C12, wherein the first etchant gas upon plasma activation is employed to etch the silicon containing dielectric layers.

Preferably, the first etching plasma 48 also employs: (1) a reactor chamber pressure of from about 100 to about 600 mTorr; (2) a source radio frequency power of from about 200 to about 550 watts at a source radio frequency of 13.56 MHz; (3) a bias power of from about 1 to about 50 watts; (4) a semiconductor substrate 30 temperature of from about 30 to about 60 degrees centigrade; (5) a CF4 gas flow rate of from about 60 to about 700 standard cubic centimeters per minute (sccm); followed in sequence by a combined CF4 gas flow rate of from about 60 to about 700 standard cubic centimeters per minute (sccm) and an O2 gas flow rate of from about 4 to about 12 standard cubic centimeters per minute (sccm) for a time period sufficient to etch through completely the blanket second silicon oxide layer 42, the blanket silicon nitride layer 40, the blanket first silicon oxide layer 38 and to essentially remove the polymer residues 46a, 46b, 46c and 46d formed on the sidewalls of the patterned dielectric layers 38, 40 and 42 and the polysilicon layer 36 during the etching reactions; and (6) a HBr gas flow rate of from about 20 to about 150 standard cubic centimeters per minute (sccm) and a chlorine gas flow rate of from about 60 to about 300 standard cubic centimeters per minute (sccm) for a time period sufficient to etch completely through the blanket dielectric layers.

Figure 7:
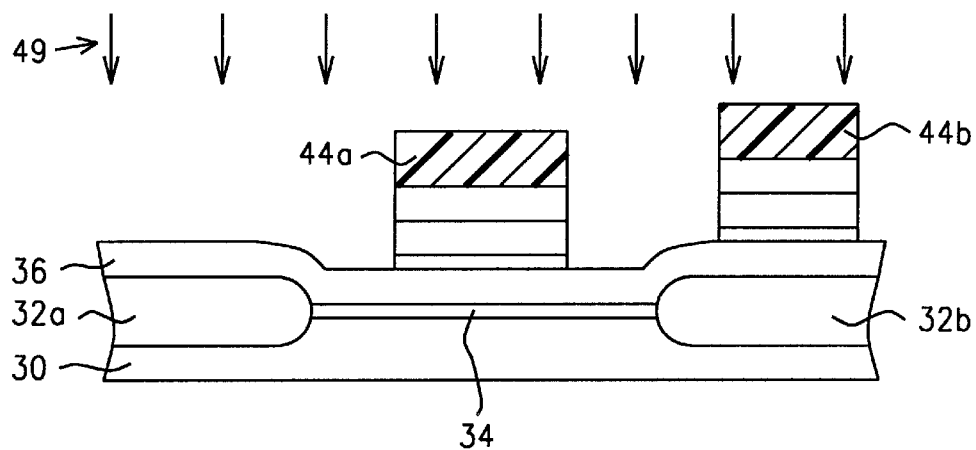

Referring now to FIG. 7, there is shown a schematic cross-sectional diagram illustrating the results of further processing of the semiconductor integrated circuit microelectronics fabrication whose schematic cross-sectional diagram is shown in FIG. 6. Shown in FIG. 7 is a semiconductor integrated circuit microelectronics fabrication otherwise equivalent to the semiconductor integrated circuit microelectronics fabrication shown in FIG. 6, but wherein there has been stripped from the patterned dielectric layers 38a–b, 40a–b and 42a–b and the polysilicon layer 36 the polymer residues 46a, 46b, 46c and 46d, and there has been etched the blanket polysilicon layer 36 to form the patterned polysilicon layers 36a–b employing the second plasma etch 49.

With respect to the second plasma etch 49, the second plasma etch 49 is equivalent or analogous to the second plasma etch process 22 shown in. FIG. 3 of the first preferred embodiment of the present invention.

Figure 8:
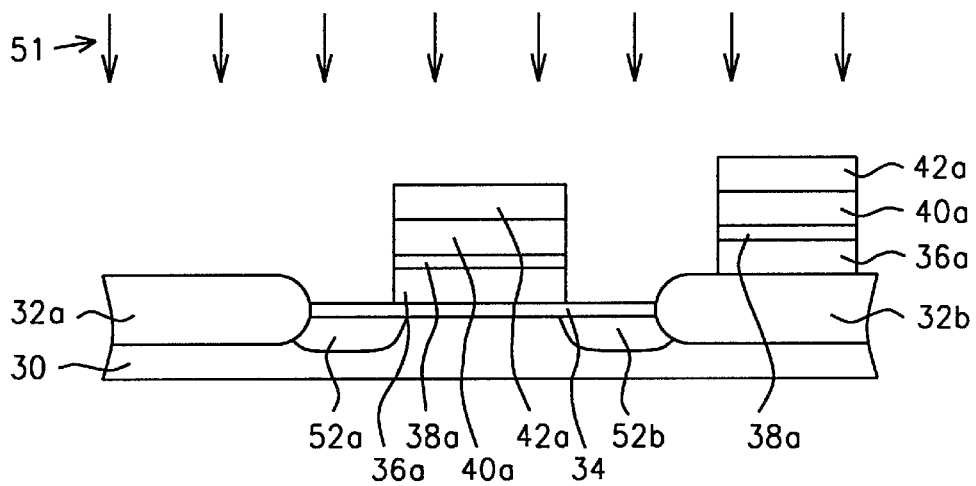

Referring now to FIG. 8, there is shown a schematic cross-sectional diagram illustrating the results of further processing of the integrated circuit microelectronics fabrication whose schematic cross-sectional diagram is illustrated in FIG. 7. Shown in FIG. 8 is a schematic cross-sectional diagram of a semiconductor integrated circuit microelectronics fabrication otherwise equivalent to the semiconductor integrated circuit microelectronics fabrication whose schematic cross-sectional diagram is illustrated in FIG. 7, but wherein the patterned photoresist layers 44a and 44b are stripped from the semiconductor integrated circuit microelectronics fabrication to yield a pair of patterned composite silicon oxide/silicon nitride/silicon oxide/polysilicon multilayer stack layers 50a and 50b comprising the patterned polysilicon layer 36a–b upon which is the patterned first silicon oxide layer 38a–b, the patterned silicon nitride layer 40a–b and the patterned second silicon oxide layer 42a–b.

Shown also within FIG. 8 formed within the active region of the semiconductor substrate 30 at areas not covered by the patterned composite stack layer 50a is a pair of source/drain regions 52a and 52b. The source/drain regions 52a and 52b may be formed into the active region of the semiconductor substrate 30 employing methods and materials as are conventional in the art of microelectronics fabrication, such methods typically including ion implant methods employing appropriate dopant ions at an ion implant dosage of from about $1\times10^{15}$ to about $6\times10^{15}$ dopant ions per square centimeter and an ion implant energy of from about 90 to about 110 kiloelectronvolts (kev).

Upon forming the semiconductor integrated microelectronic fabrication whose schematic cross-sectional diagram is illustrated in FIG. 8, there is formed a semiconductor integrated circuit microelectronics fabrication having formed therein a field effect transistor (FET) employing as its gate electrode a patterned composite stack layer comprising a patterned polysilicon layer upon which is co-extensively formed a patterned first silicon oxide layer, a patterned silicon nitride layer, and a patterned second silicon oxide layer. Such field effect transistors (FETs) are useful within electrically erasable programmable read only memory (EEPROM) semiconductor integrated circuits. The gate electrode within the field effect transistor (FET) is formed simultaneously with a second patterned composite polysilicon layer/silicon oxide layer/silicon nitride layer/silicon oxide layer multi-layer stack layer which typically and preferably may serve as a planar capacitor within the semiconductor integrated circuit microelectronics fabrication whose schematic cross-sectional diagram is illustrated in FIG. 8 provided that a conductive top layer, not shown in FIG. 8, is provided on the stack 50b.

As is understood by a person skilled in the art, the preferred embodiments of the present invention are illustrative of the present invention rather than limiting of the present invention. Revisions and modifications may be made to methods, materials, structures and dimensions through which may be formed microelectronics fabrications and semiconductor integrated circuits microelectronics fabrications having formed therein patterned composite polysilicon layer/silicon oxide layer/silicon nitride layer/silicon oxide layer multi-layer stack layers in accord with the preferred embodiments of the present invention while still providing microelectronics fabrications and semiconductor integrated circuit microelectronics fabrications having formed therein patterned composite polysilicon layer/silicon oxide layer/silicon nitride layer/silicon oxide layer multi-layer stack layers in accord with the present invention, as defined by the appended claims.

What is claimed is:

1. A method for forming a patterned composite stack layer within a microelectronics fabrication comprising:
   providing a substrate;
   forming a gate oxide layer over the substrate;
   forming over the gate oxide layer, a blanket silicon layer;
   forming upon the blanket silicon layer a blanket silicon containing dielectric layer;
   forming upon the blanket silicon containing dielectric layer a patterned photoresist layer;
   etching the blanket silicon containing dielectric layer while employing a first plasma and the patterned photoresist mask as a first etch mask layer to form a patterned silicon containing dielectric layer having a polymer residue layer formed upon a sidewall of the patterned silicon containing dielectric layer and upon the blanket silicon layer, the first plasma employing a first etchant gas composition comprising a first perfluorocarbon etchant gas;
   stripping the polymer residue layer from the sidewall of the patterned silicon containing dielectric layer and the surface of the blanket silicon layer while employing a second plasma, the second plasma employing a second etchant gas composition comprising a second perfluorocarbon etchant gas and an oxygen-containing etchant gas;
   etching the blanket silicon layer and the gate oxide layer to form a patterned silicon layer and patterned gate oxide layer while employing a third plasma and at least the patterned silicon containing dielectric layer without the polymer residue layer as a second etch mask layer; and
   then removing the patterned photoresist mask.

2. The method of claim 1 wherein the substrate is employed within a microelectronics fabrication selected from the group consisting of semiconductor integrated microelectronics fabrications, solar cell microelectronics fabrication, ceramic substrate microelectronics fabrications and flat panel display microelectronics fabrications.

3. The method of claim 1 wherein the blanket silicon layer is formed from silicon material selected from the group consisting of monocrystalline materials, polycrystalline silicon materials and amorphous silicon materials.

4. The method of claim 1 wherein the blanket silicon containing dielectric layer is formed from a dielectric material selected from the group consisting of silicon oxide dielectric materials, silicon nitride dielectric materials, and silicon oxynitride dielectric materials.

5. The method of claim 1 wherein the first perfluorocarbon etchant gas and the second perfluorocarbon etchant gas are selected from the group consisting of perfluorocarbon molecules having up to five carbon atoms.

6. The method of claim 1 wherein the first etchant gas composition and the second etchant gas composition do not comprise a hydrofluorocarbon.

7. The method of claim 1 wherein the first plasma etch method, the second plasma etch method and the third plasma etch method are undertaken in situ in a single plasma reactor or a single cluster of adjoining plasma reactor chambers.

8. A method for forming a patterned composite stack layer within a microelectronics fabrication comprising:
   providing a substrate;
   forming a gate oxide layer over the substrate;
   forming over the gate oxide layer a blanket polysilicon layer;
   forming upon the blanket polysilicon layer a blanket first silicon oxide dielectric layer;
   forming upon the blanket first silicon oxide dielectric layer a blanket silicon nitride dielectric layer;

forming upon the blanket silicon nitride dielectric layer a blanket second silicon oxide dielectric layer;

forming upon the blanket second silicon oxide dielectric layer a patterned photoresist layer;

etching sequentially while employing the patterned photoresist layer as a photoresist etching mask layer the blanket second silicon oxide dielectric layer, the blanket silicon nitride layer, the blanket first silicon oxide dielectric layer, and the blanket polysilicon layer while stripping a polymer residue layer formed upon a sidewall of the etched layers and then removing the patterned photoresist mask to form:

a first patterned composite stack layer comprising a patterned second silicon dielectric layer co-extensive with a patterned silicon nitride dielectric layer in turn co-extensive with a first patterned silicon oxide dielectric layer in turn coextensive with a patterned polysilicon layer, and a second patterned composite stack layer comprising another patterned second silicon oxide dielectric layer coextensive with another patterned silicon nitride dielectric layer in turn coextensive with another first silicon oxide dielectric layer in turn coextensive with another patterned polysilicon layer, where the sequential etching is undertaken in situ employing a single plasma reaction chamber and a sequence of etching gas compositions comprising:

a first etching gas of a perfluorocarbon;

a second etching gas mixture of a perfluorocarbon and oxygen; and a third etching gas mixture of chlorine and hydrogen bromide.

9. The method of claim 8 wherein the substrate is employed within a microelectronics fabrication selected from the group consisting of semiconductor integrated circuit microelectronics fabrications, solar cell microelectronics fabrications, ceramic substrate microelectronics fabrications and flat panel display microelectronics fabrications.

10. The method of claim 8 wherein the blanket first silicon oxide layer and second silicon oxide layer are each formed by a method selected from the group consisting of chemical vapor deposition (CVD) methods, plasma enhanced chemical vapor deposition (PECVD) methods, physical vapor deposition (PVD) methods and thermal oxidation methods.

11. The method of claim 8 wherein the blanket silicon nitride layer is formed by a method selected from the group consisting of chemical vapor deposition (CVD) methods, plasma enhanced chemical vapor deposition (PECVD) methods, physical vapor deposition (PVD) methods, thermal nitridation methods and ion implant nitridation methods.

12. The method of claim 8 wherein the semiconductor substrate is a silicon semiconductor substrate employed within a semiconductor integrated circuit microelectronics fabrication.

13. The method of claim 8 wherein the first patterned composite stack layer is employed as a polysilicon capacitor within the semiconductor integrated circuit microelectronics fabrication and the second patterned composite stack layer is employed as a gate electrode within a field effect transistor (FET) within the semiconductor integrated circuit microelectronics fabrication.

14. The method of claim 8 wherein the first perfluorocarbon etchant gas and the second perfluorocarbon etchant gas are selected from the group of perfluorocarbons having up to five carbon atoms.

15. The method of claim 8 wherein the first etchant gas composition and the second etchant gas composition do not comprise a hydrofluorocarbon.

16. The method of claim 8 wherein the first plasma etch method, the second plasma etch method and the third plasma etch method are undertaken in situ within a single plasma reactor chamber or a single cluster of adjoining reactor chambers.

17. The method of claim 1, wherein the blanket silicon containing dielectric layer etching step, the polymer residue layer stripping step, and the blanket silicon layer/gate oxide layer etching step are performed in situ.

18. The method of claim 1, wherein the blanket silicon containing dielectric layer is comprised of polysilicon having incorporated therein a suitable dopant at a concentration of from about $1 \times 10^{15}$ to about $1 \times 10^{16}$ dopant atoms per cubic centimeter to provide the blanket silicon containing dielectric layer with a resistivity of from about 7 to about 15 ohms per square.

19. The method of claim 1, wherein the blanket silicon containing dielectric layer has a thickness of about 3000 Å.

20. The method of claim 8, wherein the blanket first silicon oxide dielectric layer has a thickness from about 30 to 200 Å, the blanket silicon nitride dielectric layer has a thickness from about 200 to 700 Å, and the blanket second silicon oxide dielectric layer has a thickness from about 300 to 900 Å.

21. The method of claim 8, wherein the sequence of etching gas compositions further employs:

a pressure of from about 100 to 600 mTorr within the single plasma reaction chamber;

a source radio frequency power of from about 200 to about 550 watts at a source radio frequency of 13.56 MHz;

a bias power of from about 1 to about 50 watts;

a substrate temperature of from about 30 to about 60° C.;

a first etching perfluorocarbon ($CF_4$) gas flow rate of from about 60 to about 700 sccm;

sequentially following the first etching perfluorocarbon ($CF_4$) gas step, a second etching $CF_4/O_2$ gas mixture having a combined $CF_4$ gas flow rate of from about 60 to about 700 sccm and an $O_2$ gas flow rate of from about 4 to about 12 sccm for a time period sufficient to etch through completely the blanket second silicon oxide dielectric layer, the blanket silicon nitride dielectric layer, the blanket first silicon oxide dielectric layer and to essentially remove polymer residues formed on sidewalls of the patterned blanket second silicon oxide dielectric, the blanket silicon nitride dielectric, and the blanket first silicon oxide dielectric layers, and the blanket polysilicon layer during the etching reactions;

and a third etching chlorine/hydrogen bromide gas mixture having a chlorine gas flow rate of from about 60 to about 300 sccm and a hydrogen bromide gas flow rate of from about 20 to about 150 sccm and a for a time period sufficient to etch completely through the blanket second silicon oxide dielectric, the blanket silicon nitride dielectric, the blanket first silicon oxide dielectric, and the blanket polysilicon layers.

22. A method for forming a patterned composite stack layer within a microelectronics fabrication comprising:

providing a substrate;

forming a gate oxide layer over the substrate;

forming over the gate oxide layer a blanket polysilicon layer;

forming upon the blanket polysilicon layer a blanket first silicon oxide dielectric layer having a thickness from about 30 to 200 Å;

forming upon the blanket first silicon oxide dielectric layer a blanket silicon nitride dielectric layer having a thickness from about 200 to 700 Å;

forming upon the blanket silicon nitride dielectric layer a blanket second silicon oxide dielectric layer having a thickness from about 300 to 900 Å;

forming upon the blanket second silicon oxide dielectric layer a patterned photoresist layer;

etching sequentially while employing the patterned photoresist layer as a photoresist etching mask layer the blanket second silicon oxide dielectric layer, the blanket silicon nitride layer, the blanket first silicon oxide dielectric layer, and the blanket polysilicon layer while stripping a polymer residue layer formed upon a sidewall of the etched layers and then removing the patterned photoresist mask to form:

a first patterned composite stack layer comprising a patterned second silicon dielectric layer co-extensive with a patterned silicon nitride dielectric layer in turn co-extensive with a first patterned silicon oxide dielectric layer in turn coextensive with a patterned polysilicon layer, and a second patterned composite stack layer comprising another patterned second silicon oxide dielectric layer coextensive with another patterned silicon nitride dielectric layer in turn coextensive with another first silicon oxide dielectric layer in turn coextensive with another patterned polysilicon layer, where the sequential etching is undertaken in situ employing a single plasma reaction chamber and a sequence of etching gas compositions comprising:

a first etching gas of a perfluorocarbon;

a second etching gas mixture of a perfluorocarbon and oxygen; and a third etching gas mixture of chlorine and hydrogen bromide.

23. The method of claim 22, wherein the sequence of etching gas compositions further employs:

a pressure of from about 100 to 600 mTorr within the single plasma reaction chamber;

a source radio frequency power of from about 200 to about 550 watts at a source radio frequency of 13.56 MHz;

a bias power of from about 1 to about 50 watts;

a substrate temperature of from about 30 to about 60° C.;

a first etching perfluorocarbon ($CH_4$) gas flow rate of from about 60 to about 700 sccm;

sequentially following the first etching perfluorocarbon ($CH_4$) gas step, a second etching $CF_4/O_2$ gas mixture having a combined $CF_4$ gas flow rate of from about 60 to about 700 sccm and an $O_2$ gas flow rate of from about 4 to about 12 sccm for a time period sufficient to etch through completely the blanket second silicon oxide dielectric layer, the blanket silicon nitride dielectric layer, the blanket first silicon oxide dielectric layer and to essentially remove polymer residues formed on sidewalls of the patterned blanket second silicon oxide dielectric, the blanket silicon nitride dielectric, and the blanket first silicon oxide dielectric layers, and the blanket polysilicon layer during the etching reactions;

gas and a third etching chlorine/hydrogen bromide gas mixture having a chlorine gas flow rate of from about 60 to about 300 sccm and a hydrogen bromide gas flow rate of from about 20 to about 150 sccm and a for a time period sufficient to etch completely through the blanket second silicon oxide dielectric, the blanket silicon nitride dielectric, the blanket first silicon oxide dielectric, and the blanket polysilicon layers.

24. A method for forming a patterned composite stack layer within a microelectronics fabrication comprising:

providing a substrate;

forming a gate oxide layer over the substrate;

forming over the gate oxide layer, a blanket silicon layer;

forming upon the blanket silicon layer a blanket silicon containing dielectric layer;

forming upon the blanket silicon containing dielectric layer a patterned photoresist layer;

then etching the blanket silicon containing dielectric layer while employing a first plasma and the patterned photoresist mask as a first etch mask layer to form a patterned silicon containing dielectric layer having a polymer residue layer formed upon a sidewall of the patterned silicon containing dielectric layer and upon the blanket silicon layer, the first plasma employing a first etchant gas composition comprising a first perfluorocarbon etchant gas;

then stripping the polymer residue layer from the sidewall of the patterned silicon containing dielectric layer and the surface of the blanket silicon layer while employing a second plasma, the second plasma employing a second etchant gas composition comprising a second perfluorocarbon etchant gas and an oxygen-containing etchant gas;

then etching the blanket silicon layer and the gate oxide layer to form a patterned silicon layer and patterned gate oxide layer while employing a third plasma and at least the patterned silicon containing dielectric layer without the polymer residue layer as a second etch mask layer; and then removing the patterned photoresist mask.

* * * * *